(12) United States Patent
Chih

(10) Patent No.: US 11,145,388 B2
(45) Date of Patent: Oct. 12, 2021

(54) MEMORY DEVICE AND OPERATING METHOD USING THE SAME

(71) Applicant: Taiwan Semiconductor Manufacturing Co., Ltd., Hsinchu (TW)

(72) Inventor: Yu-Der Chih, Hsin-Chu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/805,867

(22) Filed: Mar. 2, 2020

(65) Prior Publication Data

US 2021/0098073 A1    Apr. 1, 2021

Related U.S. Application Data

(60) Provisional application No. 62/908,557, filed on Sep. 30, 2019.

(51) Int. Cl.
| | |
|---|---|
| *G11C 16/06* | (2006.01) |
| *G11C 29/00* | (2006.01) |
| *G11C 29/44* | (2006.01) |
| *G11C 16/30* | (2006.01) |
| *G11C 16/10* | (2006.01) |
| *G11C 29/38* | (2006.01) |

(52) U.S. Cl.
CPC ............. *G11C 29/78* (2013.01); *G11C 16/10* (2013.01); *G11C 16/30* (2013.01); *G11C 29/38* (2013.01); *G11C 29/44* (2013.01)

(58) Field of Classification Search
CPC ......... G11C 29/78; G11C 29/44; G11C 29/38; G11C 16/30; G11C 16/10
See application file for complete search history.

(56) References Cited

U.S. PATENT DOCUMENTS

| | | | |
|---|---|---|---|
| 2011/0007571 A1* | 1/2011 | Park .................... | G11C 11/5628 365/185.22 |
| 2011/0194353 A1* | 8/2011 | Hwang ................. | G11C 16/12 365/185.19 |

* cited by examiner

*Primary Examiner* — Uyen Smet
(74) *Attorney, Agent, or Firm* — JCIPRNET

(57) ABSTRACT

A memory device that includes a memory array, a program circuit, a verify circuit and a controller is introduced. The program circuit is configured to apply a program pulse to at least one memory cell to set the at least one memory cell to a target state. The verify circuit is configured to perform a verify operation to determine whether the at least one memory cell reaches the predetermine threshold and to determine a number of failed memory cells among the at least one memory cell in response to determining that at least one of the at least one memory cell does not reach the target state. The controller is configured to adjust the program pulse according to the number of the failed memory cells to generate an adjusted program pulse that is applied to the failed memory cells to set the failed memory cells to the target state.

15 Claims, 7 Drawing Sheets

MEMORY DEVICE AND OPERATING METHOD USING THE SAME

CROSS-REFERENCE TO RELATED APPLICATION

This application claims the priority benefit of U.S. provisional application Ser. No. 62/908,557, filed on Sep. 30, 2019. The entirety of the above-mentioned patent application is hereby incorporated by reference herein and made a part of this specification.

BACKGROUND

In a memory device, a program operation is performed by applying a program pulse to selected memory cells to set the selected memory cells to a target state. A verify operation is performed after applying the program pulse to determine whether the selected memory cells have reached the target state. When at least one of the selected memory cells does not reach the target state after applying the program pulse, the program pulse is adjusted according to the predetermined and fixed steps to generate an adjusted program puke. The adjustment may include repeatedly increasing a voltage level of the program pulse by a pre-determined amount until the program operation is successful or until the number of program pulse adjustments reaches a threshold.

However, because of variations during manufacturing processes of the memory device, different memory devices may have different characteristics and usage situations. Accordingly, the adjustments of the program pulse based on the pre-determined and fixed steps do not achieve high efficiency for different memos devices. In addition, the adjustments of the program pulse based on the pre-determined and fixed steps may causes a long programming time and inappropriate program pulse, thereby reducing efficiency and reliability of the memory device.

As demand for high efficiency and reliability of the memory device, there has grown a need for a creative design of the memory device and an operating method thereof that are capable of quickly determining appropriate program pulse for the memory device.

BRIEF DESCRIPTION OF THE DRAWINGS

Aspects of the present disclosure are best understood from the following detailed description when read with the accompanying figures. It is noted that, in accordance with the standard practice in industry, various features are not drawn to scale. In fact, the dimensions of the various features may be arbitrarily increased or reduced for clarity of discussion.

DESCRIPTION OF THE EMBODIMENTS

Figure 1:
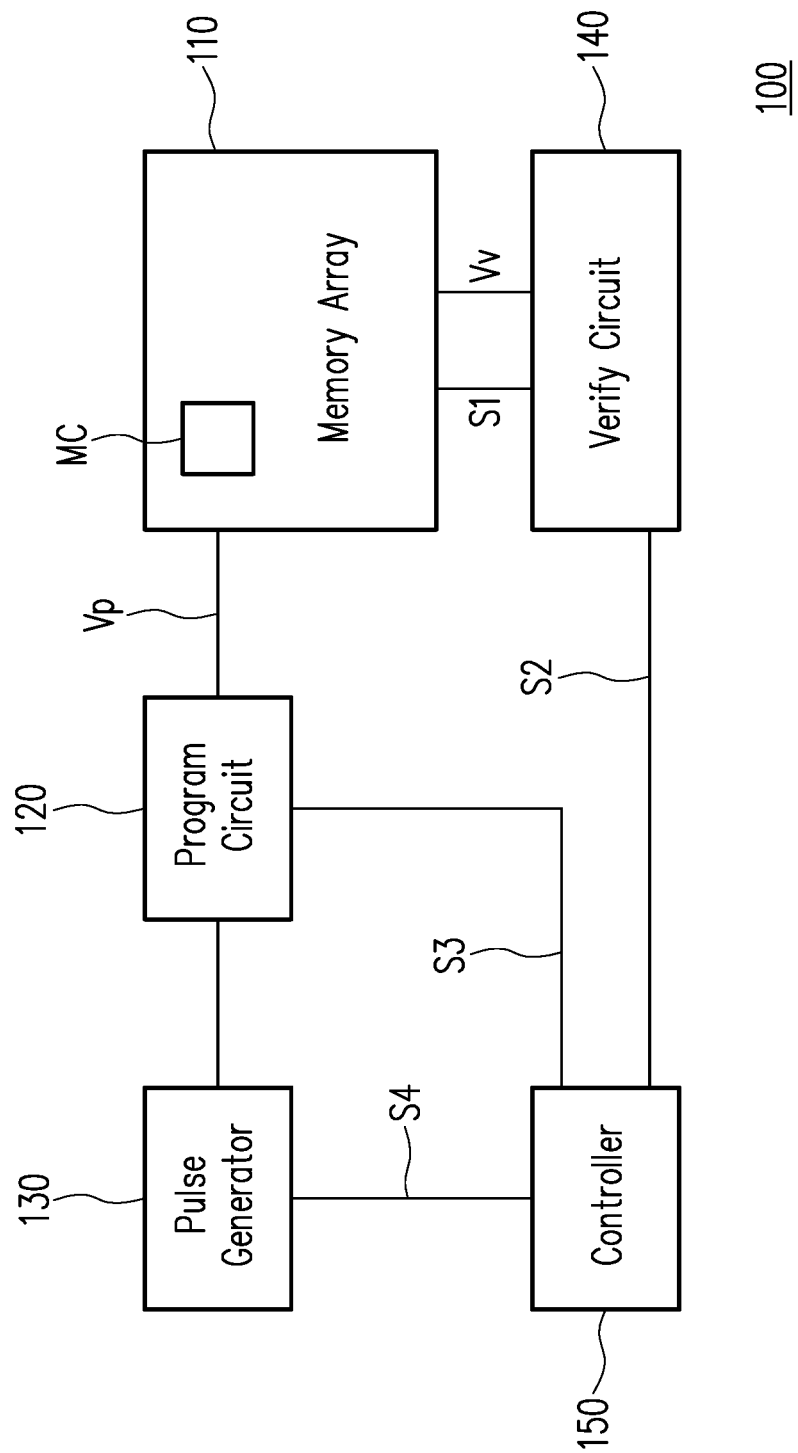
FIG. 1 is a schematic diagram illustrating a memory device in accordance with some embodiments.

The following disclosure provides many different embodiments, or examples, for implementing different features of the present disclosure. Specific examples of components and arrangements are described below to simplify the present disclosure. These are, of course, merely examples and are not intended to be icing. For example, the formation of a first feature over or on a second feature in the description that follows may include embodiments in Which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a schematic diagram of a memory device 100 in accordance with some embodiments. The memory device 100 may include a memory array 110, a program circuit 120, a pulse generator 130, a verify circuit 140 and a controller 150. The memory array 110 may include a plurality of memory cells MC that are arranged in an array. In some embodiments, the memory cells MC of the memory array 110 are arranged in memory blocks and memory pages, in which an erase operation is performed on the basis of blocks and a program operation is performed on the basis of pages. The memory cells MC may be non-volatile memory cells, and the memory array 110 may be a non-volatile memory array. In some embodiments, the memory array 110 may be a flash memory array, a resistive random-access memory (RRAM) array, a magnetic random-access memory (MRAM) array, an electrical fuse (eFUSE) random-access memory (RAM) array, an anti-fuse random-access memory (RAM) array, or any other suitable memory array.

In some embodiments, the memory cells MC is coupled to a plurality of word lines, a plurality of bit lines and a plurality of source lines (not shown) of the memory device 100. Operations such as a program operation, a read operation, an erase operation, a verify operation are performed to the memory cells MC of the memory array 110 through the bit lines, the word lines and the source lines of the memory device 100. The memory cells for a specific operation such as the program operation, the read operation, the erase operation or the verify operation may be selected through the word lines coupled to the selected memory cells.

In some embodiments, the program circuit 120 and the verify circuit 140 are configured to perform a program operation (or a write operation) to the selected memory cells among the memory cells of the memory array 110. The memory cells for the program operation may be selected by setting a program bias voltage to the word lines that are coupled to the selected memory cells. The program operation may include a program pulse applying operation and a verify operation, in which the program pulse applying operation is configured to set the selected memory cells to the target state, and the verify operation is configured to determine whether the selected memory cells reach the target state after performing the program pulse applying operation. In some embodiments, a selection of the selected memory cells for the program operation may be performed by a decoding circuit (not shown) that is included in the memory device 100 based on an address signal (not shown). The decoding circuit may receive the address signal and decode the address signal to determine the selected memory cells for the program operation.

In some embodiments, the program circuit 120 is coupled to the memory array 110 and is configured to apply a program pulse Vp to the selected memory cells during the program pulse applying operation to set the selected memory cells to the target state. The program pulse Vp may be a current pulse or a voltage pulse that is characterized by a pulse width and an amplitude. The pulse width of the program pulse Vp determines a time period for applying the program pulse to the selected memory cells, and the amplitude determines a voltage level or a current level of the program pulse being applied to the selected memory cells. In some embodiments, the program pulse Vp may be applied to the selected memory cells through the bit lines that are electrically coupled to the selected memory cells.

The verify circuit 140 is coupled to the memory array 110 and is configured to perform the verify operation to determine whether the selected memory cells reach target state after applying the program pulse Vp in the pulse applying operation. The verify circuit 140 may apply a verify reference voltage Vv to the selected memory cells to sense a threshold voltage of each of each of the selected memory cells through a response signal S1. The verify circuit 140 may compare the threshold voltage of each of the selected memory cells with a target voltage which indicates the target state to determine whether the selected memory cells reach target state. In some embodiments, a specific memory cell reaches the target state when the threshold voltage of the specific memory cell reaches the target voltage of the target state. In an example, the specific memory cell reaches the target state when the threshold voltage of the specific memory cell is greater than or equal to the target voltage of the target state. In an alternative example, the specific memory cell reaches the target state when the threshold voltage of the specific memory cell is smaller than or equal to the target voltage of the target state. In an alternative example, the specific memory cell reaches the target state when the threshold voltage of the specific memory cell is within a voltage range that includes the target voltage of the target state. The target voltage of the target state may be pre-determined based on the type of the memory cells.

In some embodiments, the selected memory cells that reach the target state after applying the program pulse Vp is considered as successful memory cells, and the selected memory cells that do not reach the target state after applying the program pulse Vp is considered as failed memory cells. When at least one of the selected memory cells does not reach the target state, the verify circuit 140 may count the number of failed memory cells among the selected memory cells of the memory array 110. In other words, the verify circuit 140 may determine a failure bit count (FBC) of the memory cells in response to determining that at least one of the selected memory cells does not reach the target state. To count the number of failed memory cells among the selected memory cells, the verify circuit 140 may apply a verify reference voltage which could be a single-level verify reference voltage or a multi-level verify reference voltage to the selected memory cells. The single-level verify reference voltage has one single voltage level, and the multi-level verify reference voltage has multiple voltage levels.

Figure 5:
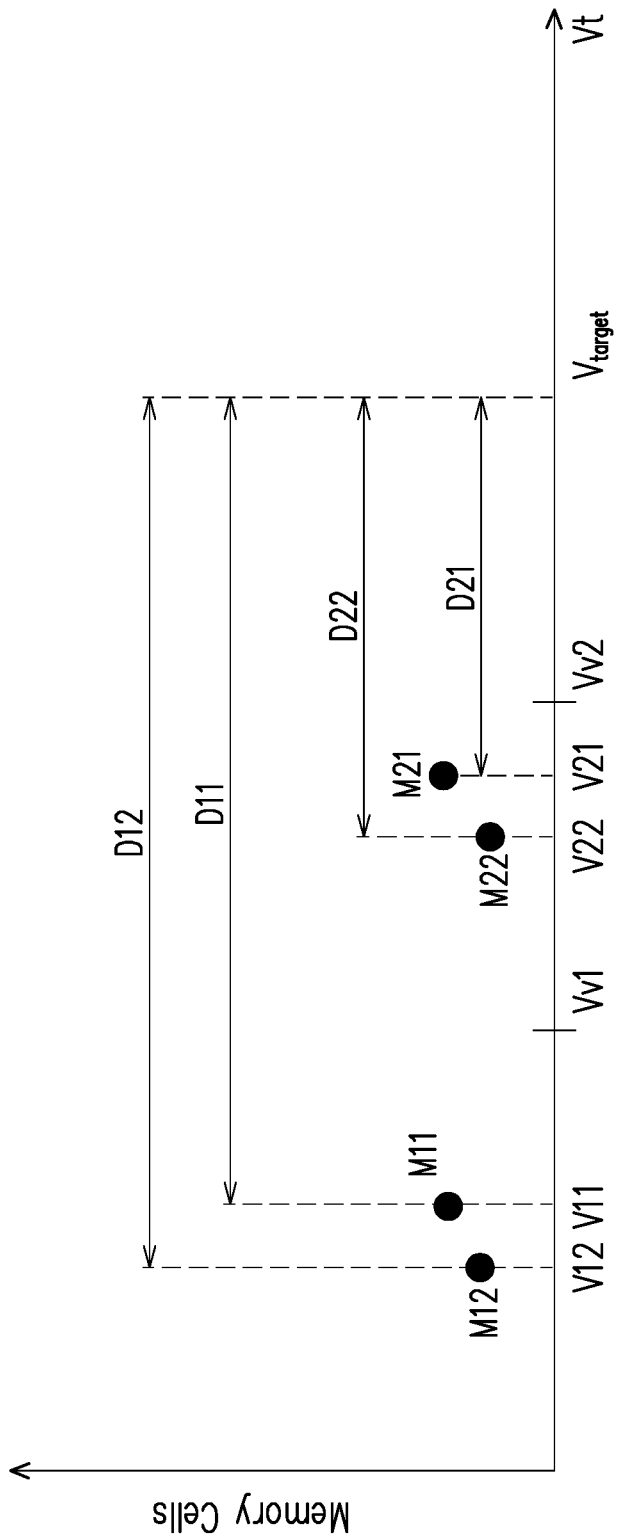
FIG. 5 illustrates exemplary failed memory cells in accordance with some embodiments.

In some embodiments, when at least one of the selected memory cells does not reach the target state, the verify circuit 140 may determine distances from the failed memory cells to the target state and classify the failed memory cells to a plurality of cell classifications (or cell groups) based on the distances from the failed memory cells to the target state. The distance from a specific failed memory cell to the target state may be a voltage difference from the threshold voltage of the specific failed memory cell to the target voltage of the target state. Referring to FIG. 5 as an example, there are four failed memory cells M11, M12, M21 and M22 after applying the program pulse Vp in the program pulse applying operation. The threshold voltages V11, V12, V21 and V22 of the failed memory cells M11, M12, M21 and M22 are all smaller than the target voltage Vtarget. The verify circuit (e.g., verify circuit 140 in FIG. 1) may determines distances D11, D12, D21 and D22 from the failed memory cells M11, M12, M21 and M22 to the target states. In some embodiments, the distance D11 is a voltage difference between the target voltage Vtarget and the threshold voltage V11 of the failed memory cell M11. The distances D12, D21 and D22 are voltage differences between the target voltage Vtarget and the threshold voltages V12, V21 and V22 of the failed memory cells M12, M21 and M22, respectively.

The verify circuit (e.g., verify circuit 140 in FIG. 1) may classified the failed memory cells M11, M12, M21 and M22 into different cell classifications based on the distances D11, D12, D21 and D22. For example, the distances D11 and D12 are relatively close to the target voltage Vtarget, and thus the failed memory cells M11 and M12 may be classified to a same cell classification (e.g., a first cell classification). The distances D21 and D22 are relatively far from the target voltage Vtarget, and thus the failed memory cells M21 and M22 may be classified to a same cell classification (e.g., a second cell classification that is different from the first cell classification). It is noted that threshold values may be used to determine the far or close relation between the threshold voltages of the failed memory cells and the target state.

Referring to FIG. 1, in some embodiments, the verify circuit 140 applies the multi-level verify reference voltage that has multiple voltage levels to the selected memory cells during the verify operation. The verify circuit 140 may determine the threshold voltages of the failed memory cells and compare the threshold voltages of the failed memory cells with the multiple voltage levels of the multi-level verify reference voltage to classify the failed memory cells to the cell classifications. For the example illustrated in FIG. 5, the multi-level verify reference voltage that includes voltage levels Vv1 and Vv2 may be applied to the selected memory cells during the verify operation. The threshold voltages V11, V12, V21 and V22 of the failed memory cells M11, M12, M21 and M22 may be compared with the voltage levels Vv1 and Vv2 of the multi-level verify reference voltage to classify the failed memory cells to the cell classifications. For example, the failed memory cells M11 and M12 are classified to a first cell classification, because the threshold voltages V11, V12 are smaller than the voltage level Vv1. The failed memory cells M11 and M12 are classified to a second cell classification, because the threshold voltages V21, V22 are in the voltage range from voltage level Vv1 to the voltage level Vv2. The number of voltage levels included in the multi-level verify reference voltage and the number of cell classifications may be determined according to the design needs. It is noted any other way to classify failed memory cells to cell classifications based on the distance from the failed memory cell to the target state fails within the scope of the disclosure.

In some embodiments, the pulse generator 130 is coupled to the program circuit 120 and the verify circuit 140 and is configured to generate the pulse program Vp for the program circuit 120 and the verify reference voltage Vv for the verify circuit 140. The pulse generator 130 may be a current generator, a voltage generator or a combination thereof that is configured to generate at least one current signal and/or at least one voltage signal for the components of the memory device 100. In some embodiments, the pulse generator 130 may includes at least one circuits that have a function of generating power such as a current pulse, a voltage pulse or a supply power to components of the memory device 100.

In some embodiments, the controller 150 is coupled to the program circuit 120, the pulse generator 130 and the verify circuit 140 and is configured to control overall operations of the memory device 100. The controller 150 may include a control logic (not shown) and/or control circuit that may control operations of the program circuit 120, the pulse generator 130 and the verify circuit 140. The controller 150 may send a control signal S3 for controlling the program circuit 120 to perform the program pulse applying operation to the selected memory cells of the memory array 110. The controller 150 may control the operation of the verify circuit 140 and/or receive information from the verify circuit 140 through a signal S2. For example, the controller 150 may send a command to control the verify circuit to apply the verify reference voltage to the selected memory cells of the memory array 110. The controller 150 may receive information indicating the number of failed memory cells and/or distances from the failed memory cells to the target state and/or cell classifications of the failed memory cells. In some embodiments, the controller 150 may assist the verify circuit 140 to count the number of the failed cells, determining the distances from the failed cells to the target state and the operations related to cell classifications.

The controller 150 may adjust the program pulse Vp to generate an adjusted program pulse according to the information provided from the signal S2 of the verify circuit 140. The controller 150 may adjust at least one of the pulse width and the amplitude of the program pulse or adjust any other characteristics of the program pulse. In some embodiments, the controller 150 adjusts the program pulse based on the number of failed memory cells. In some embodiments, the controller 150 adjusts the program pulse based on the distances from the failed memory cells to the target state. In some embodiments, the controller 150 adjusts the program pulse based on the number of failed memory cells and the distances from the failed memory cells to the target state.

The controller 150 may adjust at least one of the pulse width and the amplitude of the program pulse to generate different adjusted program pulses for different the cell classifications. For example, the cell classifications may include a first cell classification and a second cell classification, in which the distances from the failed memory cells in the first cell classification to the target state is different from distances from the failed memory cells in the second cell classification to the target state. The controller 150 may adjust the program pulse to generate a first adjusted program pulse for the first cell classification, and to generate a second adjusted program pulse for the second cell classification, wherein the first adjusted program pulse is different from the second adjusted program pulse.

In some embodiments, the controller 150 adjusts the program pulse for a specific cell classification based on an average of the distances of the failed memory cells included in the specific cell classification. In some embodiments, the controller 150 adjusts the program pulse for a specific cell classification based on the closest distance or farthest distance among the distances of failed memory cells included in the specific cell classification.

The controller 150 may control the pulse generator 130 through the control signal S4 to generate the adjusted program pulse. The program circuit 120 may apply the adjusted program pulse received from the pulse generator 130 to the memory array 110 to set the failed memory cells to the target states.

Figure 2:
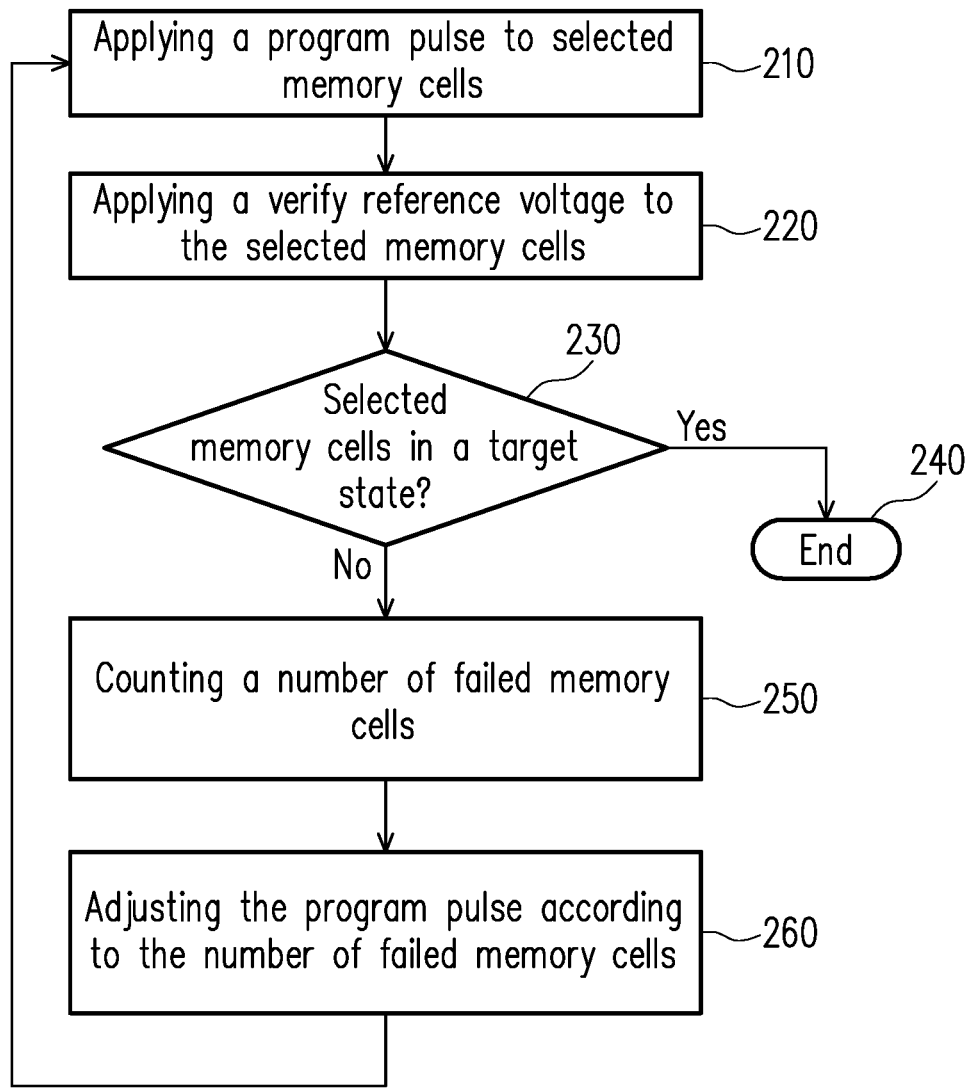
FIG. 2 is a flowchart diagram illustrating a process for adjusting a program pulse according to a number of failed memory cells in according with some embodiments.

FIG. 2 illustrates a process for adjusting a program pulse in a program operation based on a number of failed memory cells in according with some embodiments. The program operation may include a program pulse applying operation and a verify operation, in which the program pulse applying operation is configured to set selected memory cells to a target state and the verify operation is configured to determine whether the selected memory cells reach the target state. In block 210, a program pulse is applied to the selected memory cell in the program pulse applying operation to set the selected memory cells to the target state. The program pulse may be characterized by a pulse width and an amplitude, where the pulse width indicates the time period for applying the program pulse and the amplitude indicates a level (e.g., voltage level or current level) of the program pulse.

In blocks 220 and 230, a verify reference voltage is applied to the selected memory cells in the verify operation to determine whether the selected memory cells reach the target state. In some embodiments, the selected memory cells reach the target state when threshold voltages of the selected memory cells after applying the program pulse reach a target voltage of the target state. When all the selected memory cells reach the target state, the program operation is ended successfully in block 240.

When at least one of the selected memory cells does not reach the target state, a number of failed memory cells among the selected memory cells is counted in block 250. The failed memory cells are the memory cells having the threshold voltages that do not reach the target state. In block 260, the program pulse is adjusted according to the number of failed memory cells. At least one of the pulse width and the amplitude of the program pulse is adjusted according to the number of failed memory cells to generate an adjusted program pulse. In some embodiments, as the number of failed memory cells increases, the at least one of the pulse width and the amplitude of the program pulse is increased; and as the number of failed memory cells decreases, the at least one of the pulse width and the amplitude of the program pulse is decreased. Since the program pulse is adjusted according to the number of failed memory cells, more accurate adjustment to the program pulse is achieved. As a result, the processing time of the program operation in the memory device is reduced, and the performance and reliability of the memory device are improved.

Figure 3:
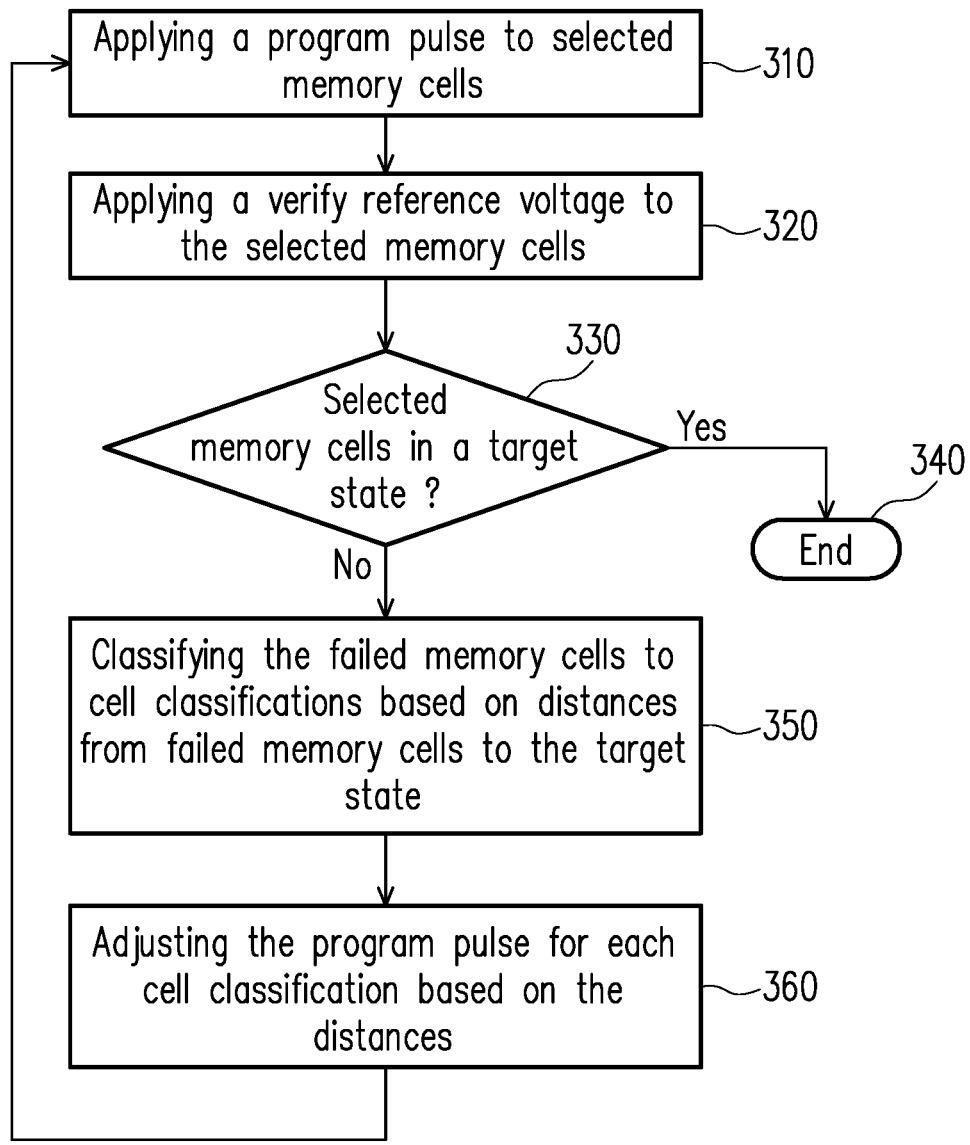
FIG. 3 is a flowchart diagram illustrating a process for adjusting a program pulse a process for adjusting a program pulse distances from failed memory cells to a target state in according with some embodiments.

FIG. 3 illustrates a process for adjusting a program pulse in a program operation based on distances from failed memory cells to target state in according with some embodiments. In block 310, a program pulse is applied to the selected memory cells in the program pulse applying operation to set the selected memory cells to the target state. The program pulse may be characterized by a pulse width and an amplitude, where the pulse width indicates the time period for applying the program pulse and the amplitude indicates a level (e.g., voltage level or current level) of the program pulse.

In blocks 320 and 330, a verify reference voltage is applied to the selected memory cells in the verify operation to determine whether the selected memory cells reach the target state. In some embodiments, the verify reference voltage may be a multi-level verify reference voltage that has multiple voltage levels. In some embodiments, the selected memory cells reach the target state when threshold voltages of the selected memory cells after applying the program pulse reach a target voltage of the target state. When all the selected memory cells reach the target state, the program operation is ended successfully in block 340.

When at least one of the selected memory cells does not reach the target state, failed memory cells are classified to cell classifications based on distances from failed memory cells to the target state in block 350. The failed memory cells are the memory cells does not reach the target state after applying the program pulse. The distances from failed memory cells to the target state may be voltage differences between the threshold voltages of the failed memory cells and the target voltage of the target state.

In block 360, the program pulse for each cell classification is adjusted according to distances from failed memory cells to the target state in block 350. In some embodiments, the adjusted program pulse for a specific cell classification is obtained based on the distances of the failed memory cells included in the specific cell classification. For example, the distances of the failed memory cells included in the specific cell classification may be averaged to generate an average distance, and the program pulse for the specific cell classification is adjusted based on the average distance. In another examples, the program pulse for the specific cell classification is adjusted based on the closest or farthest distance among the distances of the failed memory cells included in the specific cell classification. Since the failed memory cells are classified to cell classifications and the program pulse is adjusted for each cell classification, the program pulse is accurately adjusted for the failed memory cells. As a result, the processing time of the program operation in the memory device is reduced, and the performance and reliability of the memory device are improved.

Figure 4:
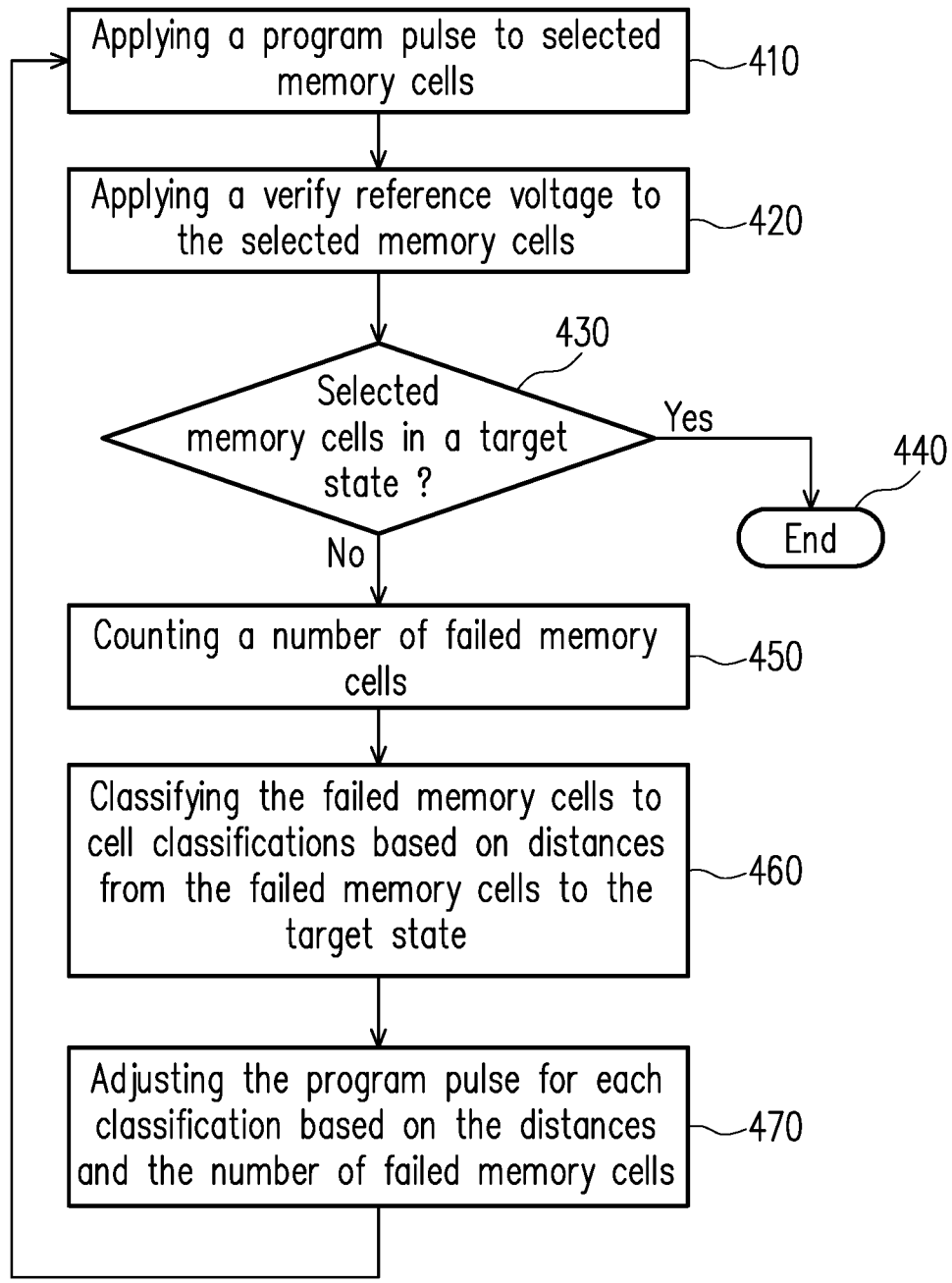
FIG. 4 is a flowchart diagram illustrating a process for adjusting a program pulse according to a number of failed memory cells and distances from the failed memory cells to a target state in according with some embodiments.

FIG. 4 illustrates a process for adjusting a program pulse in a program operation based on a number of failed memory cells and distances from the failed memory cells to target state in according with some embodiments. A difference between the process for adjusting the program pulse in FIG. 4 and the processes for adjusting the program pulse in FIG. 2 and FIG. 3 is that the program pulse adjustment employs both the number of failed memory cells and the distances from the failed memory cells to target state for adjusting the program pulse.

In block 410, a program pulse is applied to the selected memory cells in the program pulse applying operation to set the selected memory cells to the target state. In block 420 and 430, a verify reference voltage is applied to the selected memory cells in the verify operation to determine whether the selected memory cells reach the target state. The verify reference voltage may be a multi-level verify reference voltage that has multiple voltage levels. When all the selected memory cells reach the target state, the program operation is ended successfully in block 440.

When at least one of the selected memory cells does not reach the target state, the number of the failed memory cells are counted in block 450 and the failed memory cells are classified to cell classifications based on distances from failed memory cells to the target state in block 460. The failed memory cells are the memory cells does not reach the target state after applying the program pulse. The distances from failed memory cells to the target state may be voltage differences between the threshold voltages of the failed memory cells and the target voltage of the target state.

In block 470, the program pulse for each cell classification is adjusted according to the number of failed memory cells and the distances from failed memory cells to the target state in block 350. In some embodiments, the adjusted program pulse for a specific cell classification is obtained based on the distances of the failed memory cells included in the specific cell classification and the number of the total number of failed memory cells in the memory device (e.g., memory device 100 in FIG. 1). In some embodiments, the adjusted program pulse for a specific cell classification is obtained based on the distances of the failed memory cells included in the specific cell classification and the number of the number of failed memory cells included in the specific cell classification. The distances of the failed memory cells included in the specific cell classification may be averaged to generate an average distance, and the program pulse for the specific cell classification may be adjusted based on the average distance. The program pulse for the specific cell classification may be adjusted based on the closest or farthest distance among the distances of the failed memory cells included in the specific cell classification. Since both the number of failed memory cells and the distances from the failed memory cells to target state for adjusting the program pulse are used for adjusting the program pulse, the program pulse is accurately adjusted for the failed memory cells and the performance and reliability of the memory device are improved.

Figure 6:
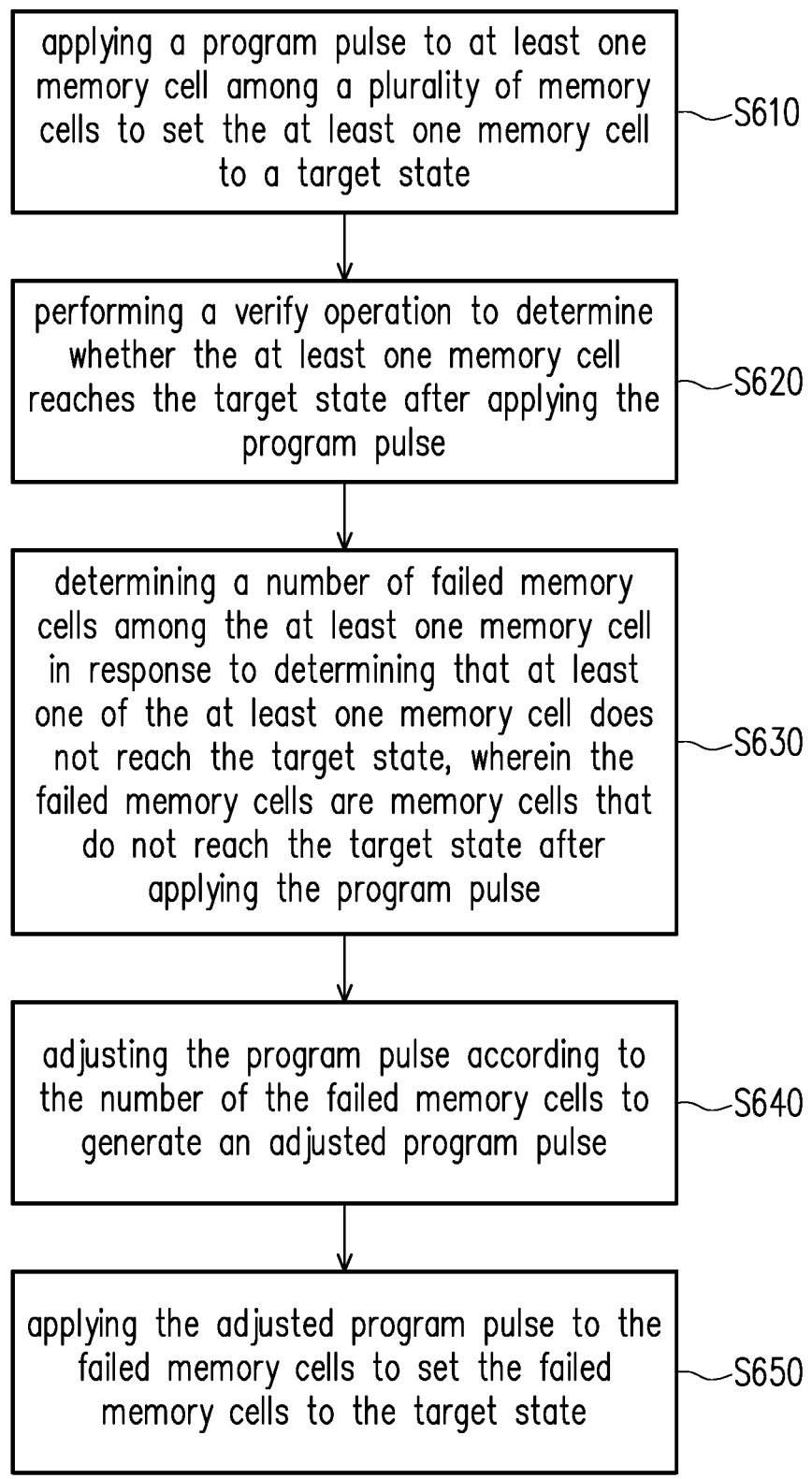
FIG. 6 is a flowchart diagram illustrating an operating method of a memory device in accordance with some embodiments.

FIG. 6 is a flowchart diagram illustrating an operating method of a memory device in accordance with some embodiments. In step S610, a program pulse is applied to at least one memory cell among a plurality of memory cells to set the at least one memory cell to a target state. In step S620, a verify operation is performed to determine whether the at least one memory cell reaches the target state after applying the program pulse.

In response to determining that at least one of the at least one memory cell does not reach the target state, a number of failed memory cells among the at least one memory cell is determined in step S630. The failed memory cells are memory cells that do not reach the target state after applying the program pulse. In step S640, the program pulse is adjusted according to the number of the failed memory cells to generate an adjusted program pulse. In some embodiments, at least one of a pulse width of the program pulse and an amplitude of the program pulse is adjusted according to the failed memory cells to generate the adjusted program pulse. In step S650, the adjusted program pulse is applied to the failed memory cells to set the failed memory cells to the target state.

Figure 7:
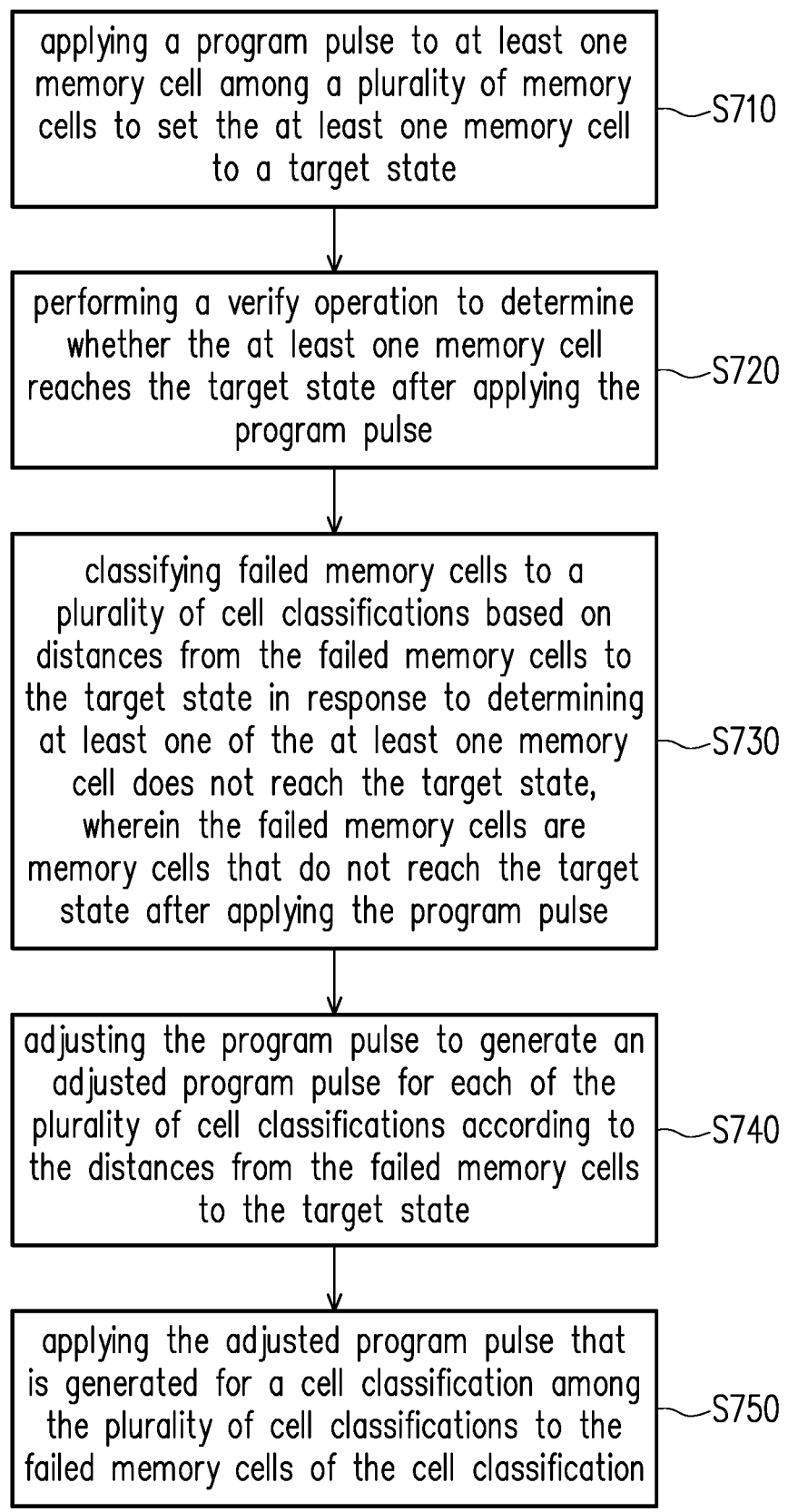
FIG. 7 is a flowchart diagram illustrating an operating method of a memory device in accordance with some alternative embodiments.

FIG. 7 is a flowchart diagram illustrating an operating method of a memory device in accordance with some alternative embodiments. In step S710, a program pulse is applied to at least one memory cell among a plurality of memory cells to set the at least one memory cell to a target state. In step S720, a verify operation is performed to determine whether the at least one memory cell reaches the target state after applying the program pulse. In some embodiments, verify operation may be performed by applying a multi-level verify reference voltage that has multiple voltage levels to the at least one memory cell.

In response to determining at least one of the at least one memory cell does not reach the target state, failed memory cells are classified to a plurality of cell classifications based on distances from the failed memory cells to the target state in step S730. The failed memory cells are memory cells that do not reach the target state after applying the program pulse.

In step S740, the program pulse is adjusted to generate an adjusted program pulse for each of the plurality of cell classifications according to the distances from the failed memory cells to the target state. In some embodiments, the adjusted program pulse for a specific cell classification is adjusted based on the distances of the failed memory cells of the specific cell classification. In step S750, the adjusted program pulse that is generated for a cell classification among the plurality of cell classifications is applied to the failed memory cells of the cell classification. The adjusted program pulse for a specific cell classification is applied to the failed memory cells of the specific cell classification.

In accordance with some embodiments, a program pulse for a program operation in a memory device is adjusted based on at least one of a number of the failed memory cells and distances from the failed memory cells to the target state. The failed memory cells may be classified to a plurality of cell classifications, and the program pulse is adjusted for failed memory cells in each cell classification. The program pulse may be a current program pulse or a voltage program pulse, and at least one of a pulse width and amplitude of the program pulse may be adjusted. In this way, the error rate and the processing time of the program operation is reduced. Accordingly, the performance and the reliability of the memory device are improved.

In accordance with some embodiments, a memory device includes a memory array, a program circuit, a verify circuit and a controller. The memory array includes a plurality of memory cells. The program circuit is coupled to the memory array and is configured to apply a program pulse to at least one memory cell among the plurality of memory cells to set the at least one memory cell to a target state. The verify circuit is coupled to the memory array and is configured to perform a verify operation to determine whether the at least one memory cell reaches the predetermine threshold and to determine a number of failed memory cells among the at least one memory cell in response to determining that at least one of the at least one memory cell does not reach the target state. The failed memory cells are memory cells that do not reach the target state after applying the program pulse. The controller is coupled to the verify circuit and is configured to adjust the program pulse according to the number of the failed memory cells to generate an adjusted program pulse. The program circuit is further configured to apply the adjusted program pulse to the failed memory cells to set the failed memory cells to the target state.

In accordance with some embodiments, an operating method of a memory device having a plurality of memory cells is introduced. The operating method includes steps of applying a program pulse to at least one memory cell among the plurality of memory cells to set the at least one memory cell to a target state; performing a verify operation to determine whether the at least one memory cell reaches the target state after applying the program pulse; determining a number of failed memory cells among the at least one memory cell in response to determining that at least one of the at least one memory cell does not reach the target state, wherein the failed memory cells are memory cells that do not reach the target state after applying the program pulse; adjusting the program pulse according to the number of the failed memory cells to generate an adjusted program pulse; and applying the adjusted program pulse to the failed memory cells to set the failed memory cells to the target state.

In accordance with some embodiments, an operating method of a memory device having a plurality of memory cells is introduced. The operating method includes steps of applying a program pulse to at least one memory cell among the plurality of memory cells to set the at least one memory cell to a target state; performing a verify operation to determine whether the at least one memory cell reaches the target state after applying the program pulse; classifying failed memory cells to a plurality of cell classifications based on distances from the failed memory cells to the target state in response to determining at least one of the at least one memory cell does not reach the target state, wherein the failed memory cells are memory cells that do not reach the target state after applying the program pulse; adjusting the program pulse to generate an adjusted program pulse for each of the plurality of cell classifications according to the distances from the failed memory cells to the target state; and applying the adjusted program pulse that is generated for a cell classification among the plurality of cell classifications to the failed memory cells of the cell classification.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An operating method of a memory device having a plurality of memory cells, the operating method comprising:
applying a program pulse to at least one memory cell among the plurality of memory cells to set the at least one memory cell to a target state;
performing a verify operation to determine whether the at least one memory cell reaches the target state after applying the program pulse;
determining a number of failed memory cells among the at least one memory cell in response to determining that at least one of the at least one memory cell does not reach the target state, wherein the failed memory cells are memory cells that do not reach the target state after applying the program pulse;
adjusting the program pulse according to the number of the failed memory cells to generate an adjusted program pulse, wherein adjusting the program pulse according to the number of the failed memory cells comprises:
increasing at least one of a pulse width of the program pulse or an amplitude of the program pulse as the number of the failed memory cells increases; and decreasing the at least one of the pulse width of the program pulse or the amplitude of the program pulse as the number of the failed memory cells decreases; and applying the adjusted program pulse to the failed memory cells to set the failed memory cells to the target state.

2. The operating method of claim 1, wherein performing the verify operation and determining the number of failed memory cells comprise:

applying a single-level verify reference voltage to the at least one memory cell to determine whether the at least one memory cell reaches the target state and to count the number of the failed memory cells.

3. The operating method of claim 1, wherein performing the verify operation comprises:

applying a multi-level verify reference voltage to the at least one memory cell to determine whether the at least one memory cell reaches the target state and to count the number of the failed memory cells, wherein the method further comprising:

classifying the failed memory cells to a plurality of cell classifications based on distances from the failed memory cells to the target state in response to determining that the at least one of the at least one memory cell does not reach the target state.

4. The operating method of claim 3, wherein adjusting the program pulse according to the number of the failed memory cells to generate an adjusted program pulse comprises:

adjusting the program pulse for the failed memory cells based on the number of failed cells and the distances from the failed memory cells to the target state.

5. The operating method of claim 3, wherein the plurality of cell classifications includes a first cell classification and a second cell classification, and the program pulse is adjusted to generate a first adjusted program pulse for the first cell classification and a second adjusted program pulse for the second cell classification.

6. The operating method of claim 5, wherein the first cell classification includes a first failed memory cell, the second cell classification includes a second failed memory cell, a first distance from the first failed memory cell to the target state is different from a second distance from the second failed memory cell to the target state, the first adjusted program pulse for the first cell classification is determined according to at least one of the number of failed memory cells and the first distance, and the second adjusted program pulse for the second cell classification is determined according to at least one of the number of failed memory cells the second distance.

7. An operating method of a memory device having a plurality of memory cells, the method comprising:

applying a program pulse to at least one memory cell among the plurality of memory cells to set the at least one memory cell to a target state;

performing a verify operation to determine whether the at least one memory cell reaches the target state after applying the program pulse;

classifying failed memory cells to a plurality of cell classifications based on distances from the failed memory cells to the target state in response to determining that at least one of the at least one memory cell does not reach the target state, wherein the failed memory cells are memory cells that do not reach the target state after applying the program pulse;

adjusting the program pulse to generate an adjusted program pulse for each of the plurality of cell classifications according to the distances from the failed memory cells to the target state, wherein adjusting at least one of the pulse-width of the program pulse or an amplitude of the program pulse comprises:

increasing the at least one of a pulse width of the program pulse or the amplitude of the program pulse as distances from the failed memory cells to the target state increase; and decreasing the at least one of the pulse width of the program pulse or the amplitude of the program pulse as the distances from the failed memory cells to the target state decrease; and applying the adjusted program pulse that is generated for a cell classification among the plurality of cell classifications to the failed memory cells of the cell classification.

8. The operating method of claim 7, wherein the plurality of cell classifications includes a first cell classification and a second cell classification, and the program pulse is adjusted to generate a first adjusted program pulse for the first cell classification and a second adjusted program pulse for the second cell classification.

9. The operating method of claim 8, wherein the first cell classification includes a first failed memory cell, the second cell classification includes a second failed memory cell, a first distance from the first failed memory cell to the target state is different from a second distance from the second failed memory cell to the target state, the first adjusted program pulse for the first cell classification is determined according to at least one of the number of failed memory cells and the first distance, and the second adjusted program pulse for the second cell classification is determined according to at least one of the number of failed memory cells the second distance.

10. The operating method of claim 8, further comprising:

counting a number of failed memory cells in the verify operation in response to determining that the at least one of the at least one memory cell does not reach the targets state, wherein the adjusted program pulse is generated based on distances from the failed memory cells to the target state and the number of failed memory cells.

11. A memory device, comprising:

a memory array, comprising a plurality of memory cells;

a program circuit, coupled to the memory array, and configured to apply a program pulse to at least one memory cell among the plurality of memory cells to set the at least one memory cell to a target state;

a verify circuit, coupled to the memory array, and configured to perform a verify operation to determine whether the at least one memory cell reaches a predetermine threshold and to determine a number of failed memory cells among the at least one memory cell in response to determining that at least one of the at least one memory cell does not reach the target state, wherein the failed memory cells are memory cells that do not reach the target state after applying the program pulse; and a controller, coupled to the verify circuit, configured to adjust the program pulse according to the number of the failed memory cells to generate an adjusted program pulse, wherein the controller increases at least one of a pulse width of the program pulse or an amplitude of the program pulse as the number of the failed memory cells increases, and the controller decreases the at least one of the pulse width of the program pulse or the amplitude of the program pulse as the number of the failed memory cells decreases, wherein the program circuit is further configured to apply the adjusted program pulse to the failed memory cells to set the failed memory cells to the target state.

12. The memory device of claim 11, wherein the verify circuit is configured to apply a single-level verify reference voltage to the at least one memory cell to determine the number of the failed memory cells.

13. The memory device of claim 11, wherein the verify circuit is configured to apply a multi-level verify reference voltage to the at least one memory cell, and the controller is configured to:
classify the failed memory cells to a plurality of cell classifications based on distances from the failed memory cells to the target state, and adjust the program pulse for each of the cell classification based on at least one of the number of failed cells and the distances from the failed memory cells to the target state.

14. The memory device of claim 13, wherein the plurality of cell classifications includes a first cell classification and a second cell classification, and the controller is configured to adjust the program pulse to generate a first adjusted program pulse for the first cell classification and a second adjusted program pulse for the second cell classification.

15. The memory device of claim 14, wherein the first cell classification includes a first failed memory cell, the second cell classification includes a second failed memory cell, a first distance from the first failed memory cell to the target state is different from a second distance from the second failed memory cell to the target state, the first adjusted program pulse for the first cell classification is determined according to at least one of the number of failed memory cells and the first distance, and the second adjusted program pulse for the second cell classification is determined according to at least one of the number of failed memory cells the second distance.

* * * * *